(12) United States Patent
Momii

(10) Patent No.: US 8,004,904 B2
(45) Date of Patent: Aug. 23, 2011

(54) SEMICONDUCTOR INTEGRATED CIRCUIT DEVICE

(75) Inventor: Masato Momii, Chitose (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 136 days.

(21) Appl. No.: 12/532,879

(22) PCT Filed: Mar. 17, 2008

(86) PCT No.: PCT/JP2008/054911
§ 371 (c)(1),
(2), (4) Date: Sep. 24, 2009

(87) PCT Pub. No.: WO2008/120568
PCT Pub. Date: Oct. 9, 2008

(65) Prior Publication Data
US 2010/0085814 A1    Apr. 8, 2010

(30) Foreign Application Priority Data
Mar. 28, 2007 (JP) ................. 2007-085584

(51) Int. Cl.
*G11C 11/34* (2006.01)
(52) U.S. Cl. ............... 365/185.25; 365/203; 365/189.15
(58) Field of Classification Search ............ 365/185.25, 365/203, 189.15, 185.03, 185.18, 185.11, 365/189.09, 185.21, 225.7, 185.09
See application file for complete search history.

(56) References Cited

U.S. PATENT DOCUMENTS

| 6,842,384 | B2 | 1/2005 | Lee |
| 6,882,570 | B2 | 4/2005 | Byeon et al. |
| 7,123,514 | B2 * | 10/2006 | Watanabe ................ 365/185.21 |
| 2003/0117847 | A1 * | 6/2003 | Makuta et al. ........... 365/185.09 |

FOREIGN PATENT DOCUMENTS

| JP | 8-314886 A | 11/1996 |
| JP | 2003-242795 A | 8/2003 |
| JP | 2004-5946 A | 1/2004 |

* cited by examiner

*Primary Examiner* — Dang T Nguyen
(74) *Attorney, Agent, or Firm* — Holtz, Holtz, Goodman & Chick PC

(57) ABSTRACT

A semiconductor integrated circuit device capable of shortening a chip reset period (time) is provided. The semiconductor integrated circuit device has a nonvolatile memory which performs a reading operation of trimming information after completion of precharge of a data line, and a power-on reset circuit (64) which starts an operation in response to power-on to reset a control circuit of the nonvolatile memory. The device further has a power-on precharge circuit (66) which starts an operation in response to the power-on to perform the precharge operation of the data line. The power-on reset circuit (64) includes a first CR operation circuit (642) which produces a reset release signal indicative of change of a voltage level at a time point when a first predetermined time period (T1) elapses from the power-on. The power-on precharge circuit (66) includes a second CR operation circuit (662) which produces a precharge completion signal indicative of change of a voltage level at a time point when a second predetermined time period (T2) elapses from the power-on. The first predetermined time period (T1) is longer than the second predetermined time period (T2).

6 Claims, 14 Drawing Sheets

(A)

(B)

SEMICONDUCTOR INTEGRATED CIRCUIT DEVICE

This application is a U.S. National Phase Application under 35 USC 371 of International Application PCT/JP2008/054911 filed Mar. 17, 2008.

TECHNICAL FIELD

This invention relates to a semiconductor integrated circuit device including a nonvolatile memory circuit which stores trimming information and performs a reading operation of the trimming information after completion of precharge of a data line.

BACKGROUND ART

A nonvolatile memory circuit is known as a ROM (read only memory).

As well known in this technical field, the ROM (read only memory) is generally classified into a mask ROM whose content is written in a manufacturing process at a semiconductor maker and a programmable ROM (PROM) which is electrically programmable by a user.

In principle, the mask ROM can be manufactured at the lowest cost among semiconductor memories. Therefore, as the mask ROM, a type of product having a large memory capacity is commercialized. On the other hand, the programmable ROM has a characteristic that programming can be performed at a user's end. The programmable ROM is classified into a narrowly-defined PROM only once programmable by a user, an EPROM (erasable and programmable ROM) electrically programmable and erasable by ultraviolet rays or the like, and an EEPROM (electrically erasable programmable ROM) electrically erasable.

The EPROM not only allows user's programming but also erasure of all data by ultraviolet irradiation and rewriting. Since a glass window for erasure by ultraviolet rays is required, the EPROM is generally contained in a ceramic package. As the narrowly-defined PROM, there is an OTP (one time programmable ROM). Although a semiconductor chip same as that of the EPROM is contained, the OTP is not erasable by ultraviolet rays because its package has no window. A user can write information only once in each memory cell of the OTP by using a typical EPROM programmer. The OTP is higher than the mask ROM and lower than the EPROM in cost. As one type of the EEPROM, there is a flash EEPROM. The flash EEPROM is called a flash memory also and means, among PROMs as a rewritable read only memory, a memory which allows electric erasure of contents of all bits (block-by-block erasure is also possible) and rewriting.

In the EEPROM, it is required to generate a high voltage (for example, 18V) when writing data. Therefore, a charge pump circuit and a voltage booster circuit are required. On the other hand, as well known in this technical field, for the purpose of reading data from a nonvolatile memory (ROM), it is required to precharge a data line of the nonvolatile memory before actually reading the data.

The EEPROM has several types of structures which are generally classified into a floating gate type EEPROM and a MONOS-type EEPROM. The floating gate type EEPROM uses transistors each comprising a gate electrode of a double structure in which a control gate is superposed on a floating gate. By applying a high voltage to the control gate, an electric charge is injected from a substrate into the floating gate and retained. On the other hand, the MONOS-type EEPROM uses transistors each comprising a gate having a MONOS (metal/oxide film/nitride film/oxide film/silicon) structure. An electric charge is injected into a trap level existing in an oxide film/nitride film/oxide film (tunnel oxide film) structure and retained. As compared to the floating type EEPROM, the MONOS-type EEPROM is easy in manufacturing process and low in rewriting voltage. It is noted here that the MONOS is a name consisting of initial letters of a Metal-Oxide film-Nitride film-Oxide film-Semiconductor (for example, see Patent Document 1).

Hereinbelow, referring to FIGS. 1 (A) and (B), the MONOS-type EEPROM described in Patent Document 1 will be described. A MONOS transistor as a main component is formed on a p-well formed on a part of a surface of a silicon substrate which is an n-type semiconductor. Electrode regions corresponding to a drain and a source are $n^+$-type semiconductors formed inside the p-well. The MONOS transistor has a gate which is different in structure from that of an ordinary transistor and which has a gate insulating film structure comprising three layers including a tunnel oxide film O1 formed on a surface of the p-well, a silicon nitride film N formed on the tunnel oxide film, and a top oxide film O2 further formed on the silicon nitride film. On a gate insulating film having the above-mentioned structure, a polysilicon gate electrode M is formed. The p-well, the drain, and the source of the MONOS transistor are provided with a first electrode P1, a second electrode P2, and a third electrode P3, respectively. These electrodes are connected to peripheral circuits to form the EEPROM.

When data is written into the MONOS-type EEPROM having the above-mentioned structure, the first electrode P1 is supplied with a rewriting voltage between −8 volts and −11 volts while the gate electrode M is kept at a reference potential. As a consequence, electrons move from the p-well through the tunnel oxide film O1 to the silicon nitride film N and stay in the nitride film N and at an interface between the nitride film N and the top oxide film O2. As a result, a threshold voltage of the MONOS transistor is increased and the transistor becomes non-conductive. In this writing, electric potentials of the other electrodes P2 and P3 are not important. Normally, however, it is suitable to keep these electrodes at the reference potential.

On the other hand, when the data is erased, the gate electrode M is supplied with a rewriting voltage between −8 volts and −11 volts while the first electrode P1 is kept at a reference potential. As a consequence, the electrons which stay in the gate insulating film move to the p-well and the threshold voltage of the NOMOS transistor is decreased. Then, the transistor exhibits a depression characteristic and becomes conductive. At this time also, the electric potentials of the other electrodes are normally kept at the reference potential.

As shown in a circuit diagram of FIG. 1(B), reading of data from the MONOS-type EEPROM is carried out by connecting the MONOS transistor and a normal enhancement-type MOS transistor in series and simultaneously turning on the two transistors to divide a power supply voltage. At this time, the gate electrode M and the second electrode P2 of the MONOS transistor and the first electrode P1 of the MONOS transistor are connected to the reference potential, while a gate G of the MOS transistor and a source electrode P4 of the MOS transistor are supplied with a power supply voltage between 2.5 volts and 6.5 volts. The third electrode P3 of the MONOS transistor and a drain of the MOS transistor are connected to each other to form a voltage dividing point. When data is written in the MONOS transistor, an output signal level becomes a H level. When data is not written into the MONOS transistor, an output signal level becomes a L level.

As a semiconductor integrated circuit chip, a chip including the EEPROM and an analog portion is known. For example, the semiconductor integrated circuit chip is used as a temperature compensation circuit for stabilizing an oscillation frequency of a quartz crystal oscillator dependent of a temperature. Specifically, since a quartz crystal has a temperature-dependent oscillation frequency, the quartz crystal is connected to the above-mentioned analog portion and the oscillation frequency of the quartz crystal is temperature-compensated by the analog portion. In this case, trimming information (adjusting information) is supplied from the EEPROM to the analog portion. With reference to a trimming value represented by the trimming information, the analog portion temperature-compensates the oscillation frequency of the quartz crystal. In this example, the EEPROM stores the trimming information. Therefore, the EEPROM is called a trimming memory. The semiconductor integrated circuit chip may simply be called a chip also. Further, in this example, the quartz crystal oscillator is a product and the analog portion inside the chip is a circuit to be trimmed with reference to the trimming information. Such a product requiring temperature compensation is not limited to the quartz crystal oscillator alone and includes, for example, an A/D converter, a D/A converter, and an internal power supply circuit each of which has an oscillator contained therein or the like.

Referring to FIG. 2, a conventional EEPROM module (nonvolatile memory circuit) 10 will be described. The EEPROM module 10 has a memory mat 12. The memory mat 12 is a memory cell array which comprises memory cells arranged in a two-dimensional matrix. The memory mat 12 is connected to a sense latch precharge MOS 14.

The EEPROM module 10 has an address bus 16 and a data bus 18. The address bus 16 is connected to the memory mat 12 via an X decoder 20 and a word driver 22. The data bus 18 is connected to the sense latch precharge MOS 14 via a Y switch 24. The address bus 16 is connected to the Y switch 24 via a Y decoder 26.

The EEPROM module 10 further comprises a booster circuit 28, a power-on reset circuit 30, and a control circuit 32. The power-on reset circuit 30 is connected to the control circuit 32. The control circuit 32 is connected to the address bus 16 and the data bus 18. The control circuit 32 performs input/output interface control, address bus/data bus register control, and read/write control.

For the EEPROM module 10 having the above-mentioned structure, a high-capacity type is mainstream. Therefore, the memory mat 12 occupies the highest percentage in a module area and a peripheral circuit portion (a portion except the memory mat 12) has an insignificant effect on a module size. For example, in a case where the EEPROM module 10 has a memory capacity of 64 kbits, the memory mat 12 has an occupancy of 80%, while the peripheral circuit portion has an occupancy of 20%.

Meanwhile, the above-mentioned product requiring temperature compensation starts an operation immediately after power is turned on. When trimming information is set for such a product (namely, the analog portion inside the chip), it is required, before the product starts an operation, to complete reading of the trimming information from the trimming memory and to enable or validate the trimming value represented by the trimming information.

Therefore, in the conventional technique, after the power-on reset circuit 30 is operated and before completion of reset of the chip, a reading operation of the trimming information held in an internal memory (trimming memory) is performed in response to a clock input from an internal oscillator (external oscillator) and under control of the special control circuit 32. After the trimming information is enabled or validated, reset of the chip is released. In other words, a chip reset period is extended so as to deal with the above-mentioned requirement.

FIG. 3 shows a conventional EEPROM module (semiconductor integrated circuit device) 10. In the EEPROM module 10 shown in FIG. 3, only a part necessary for power-on read in the EEPROM module 10 shown in FIG. 2 is extracted.

The EEPROM module 10 comprises a trimming memory 34 storing trimming information, the power-on reset circuit 30, an internal oscillator 36, a counter 38, and the control circuit 32.

The trimming memory 34 shown in FIG. 3 corresponds to a combination of the memory mat 12, the sense latch precharge MOS 14, the Y switch 24, the X decoder 20, and the word driver 22 in FIG. 2. The trimming memory 34 is connected to a circuit 40 to be trimmed with reference to the trimming information.

In response to power-on, the power-on reset circuit 30 starts an operation and produces a power-on reset signal to reset the control circuit 32 (flip-flops and latches inside the chip). The internal oscillator 36 oscillates an internal clock signal. The counter 38 performs a counting operation in synchronization with the internal clock signal to produce a count value. In response to the power-on reset signal, in synchronization with the internal clock signal, and with reference to the internal count value, the control circuit 32 performs chip reset control, memory select control, and data line precharge control.

FIG. 4 is a time chart (waveform diagram) for describing a data reading operation in the conventional EEPROM module (semiconductor integrated circuit device) 10 shown in FIG. 3. In FIG. 4, a first line shows a waveform of a power supply voltage (Vcc), a second line shows a waveform of a chip reset signal, a third line shows a waveform of the power-on reset signal, a fourth line shows a waveform of the internal clock signal, a fifth line shows a waveform of a memory select signal, and a sixth line shows a waveform of a data line precharge signal.

First, it is assumed that power is turned on at a time instant $t_1$. Consequently, from the time instant $t_1$, the power supply voltage (Vcc) is gradually increased and the chip reset signal is gradually increased also.

At a time instant $t_2$ after lapse of a predetermined time period from the time instant $t_1$, the power-on reset circuit 30 starts an operation and a voltage level of the power-on reset signal is gradually increased.

At a time point $t_3$ after lapse of a predetermined time period from the time instant $t_1$ (or a time point $t_3$ when the voltage level of the power-on reset signal reaches a predetermined voltage), the power-on reset circuit 30 makes the power-on reset signal have a zero voltage. In other words, at the time instant $t_3$, the power-on reset signal is shifted from a high level to a low level. That is, power-on reset is released. In response to the fall of the power-on reset signal, the control circuit 32 shifts the memory select signal for the trimming memory 34 from a low level to a high level and simultaneously receives the internal clock signal from the internal oscillator 36.

At a time instant $t_4$, the control circuit 32 shifts the data line precharge signal from a high level to a low level. As a result, data line precharge of the trimming memory 34 is performed.

From a time instant $t_5$ when the data line precharge signal is shifted from the low level to the high level, the control circuit 32 starts reading of the trimming information from the trimming memory 34 in synchronization with the internal clock. At a time instant $t_6$ when reading of the trimming information is completed, the control circuit 32 shifts the memory select signal from the high level to the low level.

At a time instant $t_7$, the control circuit 32 shifts the chip reset signal from a high level to a low level to release reset of the chip. As a result, the trimming value represented by the trimming information is enabled or validated.

Next, referring to FIG. 5 in addition to FIG. 2, an operation of the conventional EEPROM module (nonvolatile memory circuit) 10 will be described. FIG. 5 is a circuit diagram showing a memory cell for use in the memory mat 12 of the conventional EEPROM module 10 shown in FIG. 2.

First, description will be made of an operation in a case where data is read from the EEPROM module 10 and loaded (reading operation of the trimming memory 34 when power is turned on).

First, the control circuit 32 makes a MONOS gate have 0V and makes the memory cell well and the source line have 0V. Next, the control circuit 32 precharges the data line at a Vcc level. After lapse of a fixed time period (after completion of precharging), the control circuit 32 brings the data line into a floating state. The control circuit 32 makes a memory select gate have Vcc (ON).

Herein, when the MONOS gate has 0V, the MONOS transistor after erasure is in an on state so that the level of the data line is changed from Vcc to 0V. That is, memory data has "0" level. On the other hand, when the MONOS gate has 0V, the MONOS transistor after writing is in an off state so that the level (Vcc) of the data line is maintained. That is, the memory data has "1" level.

After lapse of a fixed time period (after completion of reading of the memory data), the control circuit 32 loads information of the data line into the latch. The control circuit 32 makes the memory select gate have 0V (OFF).

Next, a rewriting operation (erase/write) of the EEPROM module 10 will be described. In a case of the conventional EEPROM module 10, all memories share a common memory well. Therefore, the rewriting operation of the memory data is carried out on a word line basis. Specifically, a series of processes are required which include erasure of all memories on the same word line ("0" is written) and writing of "1" data into each memory to be written with "1" data (the state of each memory to be written with "0" data is kept unchanged).

First, the control circuit 32 latches memory data. Specifically, in order to enable rewriting on a byte-by-byte basis, the control circuit 32 is required to load all memory data on the same word line into the latch (because the "0" data is written in all memories on the same word line by the erasing operation, the memory data must be saved before writing).

Next, the control circuit 32 is supplied with memory rewriting data from a data input/output terminal and writes the memory rewriting data into the latch on a byte-by-byte basis. At this time, a part of latch data written in the above-mentioned latching of the memory data is rewritten (overwritten).

Next, the control circuit 32 erases all memories on the same word line (writes "0"). In detail, the control circuit 32 makes the memory select gate have a Vcc level (turns on). The control circuit 32 makes the MONOS gate have Vcc-13V. The control circuit 32 makes the source line have Vcc-1.5V. The control circuit 32 makes the memory cell well have Vcc-1.5V. The control circuit 32 maintains the above-mentioned state for 4 milliseconds. Consequently, all memories on the same word line are erased.

Next, the control circuit 32 terminates the erasing operation. In detail, the control circuit 32 makes the memory select gate have 0V (turns off). The control circuit 32 makes the MONOS gate have 0V. The control circuit 32 makes the source line have 0V. The control circuit 32 makes the memory cell well have 0V. The control circuit 32 maintains the above-mentioned state for 1 millisecond. Consequently, all memory cells on the same word line are returned to a standby state.

Next, the control circuit 32 writes "1" data in each memory cell in which "1" data is to be written.

It is assumed that the control circuit 32 writes "1" data in the memory cell. In this case, the control circuit 32 makes the memory select gate have a Vcc level (turns on). The control circuit 32 makes the MONOS gate have the Vcc level. The data line and the source line of each memory cell to be written with "1" data according to the data of the data latch are kept at Vcc-13V. The control circuit 32 maintains the above-mentioned state for 4 milliseconds. Consequently, "1" data is written in the memory cell in which "1" data is to be written.

It is assumed that the control circuit 32 does not write "1" data in the memory cell. In other words, it is assumed that the control circuit 32 makes the "0" data be held in the memory cell. In this case, the control circuit 32 makes the memory select gate have the Vcc level (turns on). The control circuit 32 makes the MONOS gate have the Vcc level. In the memory cell to hold "0" data according to the data of the data latch, the data line is kept at Vcc-1.5V and the source line is brought into a floating state. The control circuit 32 maintains the above-mentioned state for 4 milliseconds. Consequently, "0" data is held in the memory cell in which "1" data is not to be written.

Then, the control circuit 32 terminates the erasing operation. Specifically, the control circuit 32 makes the memory select gate have 0V (turns off). The control circuit 32 makes the MONOS gate have 0V. The control circuit 32 makes the source line have 0V. The control circuit 32 makes the memory cell well have 0V. The control circuit 32 maintains the above-mentioned state for 1 millisecond. Consequently, all memory cells on the same word line are returned to the standby state.

Patent Document 1: WO93/11509

DISCLOSURE OF THE INVENTION

Problem to be Solved by the Invention

However, in the conventional EEPROM module (semiconductor integrated circuit device) 10 shown in FIG. 3, a chip reset period becomes long because the reading operation of the trimming memory 34 is performed after the power-on reset is released. As a result, it is difficult to apply the conventional EEPROM module 10 to a product which is required to enable or validate a trimming value immediately after power is turned on.

Further, for the reading operation of the trimming memory 34, the conventional EEPROM module (semiconductor integrated circuit device) 10 requires the internal oscillator 36 (or an external input terminal for inputting an external clock), the counter 38, and the control circuit 32. This results in an increase in chip area. Therefore, it is difficult to apply the conventional EEPROM module 10 to a product with no room in chip size.

Furthermore, there is a problem that the power-on reset circuit 30 is varied in characteristic depending on an inclination in power supply voltage during transition.

It is therefore an object of the present invention to provide a semiconductor integrated circuit device capable of shortening a chip reset period (time).

It is another object of the present invention to provide a semiconductor integrated circuit device capable of reducing a module size.

It is still another object of the present invention to provide a semiconductor integrated circuit device capable of reducing variation in characteristic with respect to an inclination in power supply voltage during transition.

Means to Solve the Problem

According to this invention, there is provided with a semiconductor integrated circuit device comprising a nonvolatile memory which stores trimming information and performs a reading operation of the trimming information after completion of precharge of a data line, and a power-on reset circuit which starts an operation in response to power-on to reset a control circuit of the nonvolatile memory, the semiconductor integrated circuit device comprising a power-on precharge circuit which starts an operation in response to the power-on to precharge the data line of the nonvolatile memory, the reading operation of the trimming information from the nonvolatile memory is completed in a period after the completion of the precharge operation of the data line and before release of power-on reset.

In the semiconductor integrated circuit device related to the above-mentioned invention, the power-on reset circuit may include a first CR operation circuit which produces a reset release signal indicative of change of a voltage level at a time point when a first predetermined time period elapses from the power-on, the power-on precharge circuit may include a second CR operation circuit which produces a precharge completion signal indicative of change of a voltage level at a time point when a second predetermined time period elapses from the power-on. In this event, the first predetermined time period is longer than the second predetermined time period. The first CR operation circuit has a time constant greater than that of the second CR operation circuit. The first CR operation circuit and the second CR operation circuit are preferably constructed by the same kinds of circuit elements. Preferably, the power-on reset circuit may further include a first DC operation circuit which produces, in response to the power-on, another reset release signal at a stage when a power supply voltage during transition reaches a first predetermined voltage, and a first logic circuit which performs a logical operation between an output signal of the first CR operation circuit and an output signal of the first DC operation circuit to produce a reset signal, the power-on precharge circuit may further include a second DC operation circuit which produces, in response to the power-on, another precharge completion signal at a stage when the power supply voltage during transition reaches a second predetermined voltage, and a second logic circuit which performs a logical operation between an output signal of the second CR operation circuit and an output signal of the second DC operation circuit to produce a data line precharge signal. In this event, the first predetermined voltage is higher than the second predetermined voltage.

In addition, the nonvolatile memory, the power-on reset circuit, and the power-on precharge circuit may be formed on a semiconductor substrate. In this event, the power-on reset circuit and the power-on precharge circuit preferably may have circuit structures substantially identical to each other and formed on the semiconductor substrate.

Effect of the Invention

In the present invention, the power-on precharge circuit is provided which starts an operation in response to power-on to precharge the data line of the nonvolatile memory. This makes it possible to read the trimming information from the nonvolatile memory immediately after power-on. Therefore, a chip reset period (time) can be shortened and a module size can be reduced.

BEST MODE FOR EMBODYING THE INVENTION

In the present invention, a 1-bit EEPROM memory cell block includes serial transfer, data latch, a switching function of read/erasure/write, and a memory cell, which are at least necessary for an operation of a memory module. In the present invention, a memory function is completely independent on a bit-by-bit basis. Therefore, a peripheral circuit portion used in common includes only a power-on reset circuit and a power-on precharge circuit.

Figure 6:
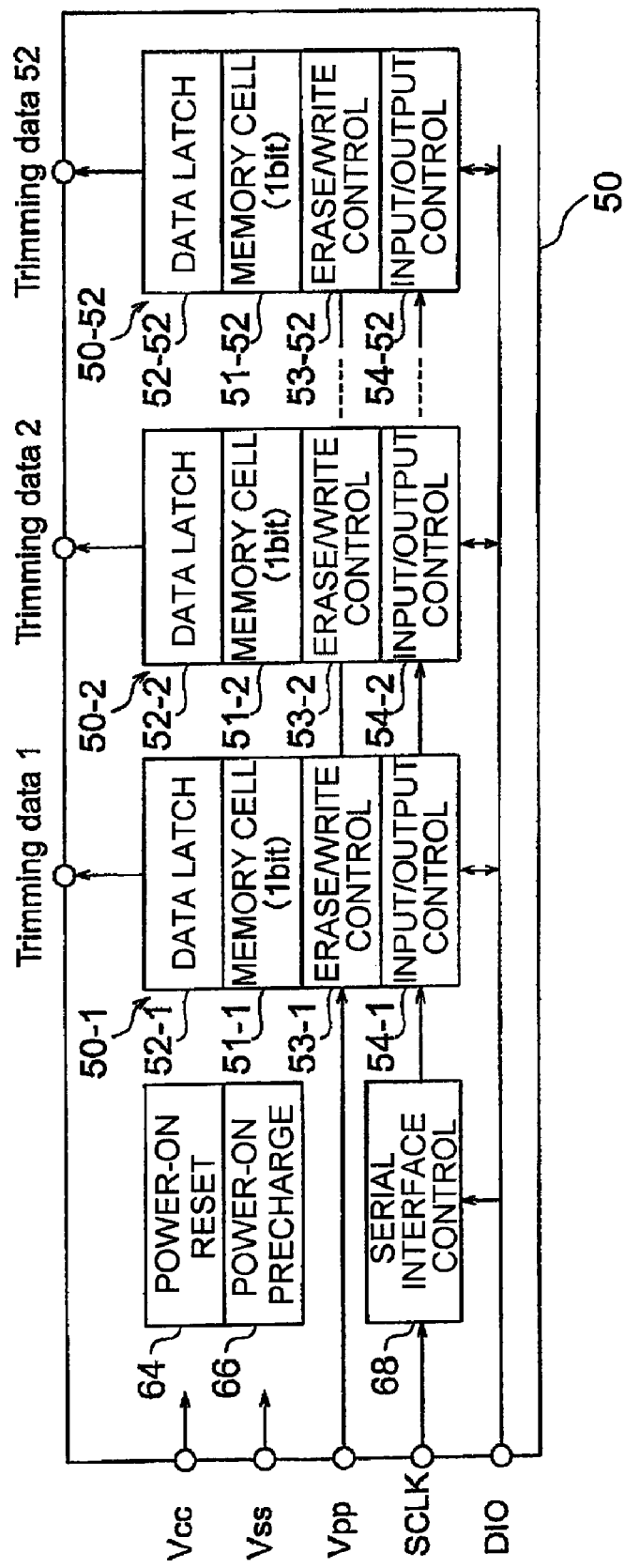
FIG. 6 is a block diagram showing a nonvolatile memory circuit according to a first embodiment of the present invention.

Referring to FIG. 6, a nonvolatile memory circuit 50 according to a first embodiment of the present invention will be described. The illustrated nonvolatile memory circuit 50 comprises first through N-th memory cell blocks 50-1, 50-2, ..., and 50-N (N is an integer not less than 2). In the example being illustrated, N is equal to 52.

The nonvolatile memory circuit 50 comprises a power-on reset circuit 64 which resets the first through the 52nd memory cell blocks 50-1 through 50-52 when power is turned on and a power-on precharge circuit 66 which precharges data lines of the first through the 52nd memory cell blocks 50-1 through 50-52 when power is turned on.

The first through the 52nd memory cell blocks 50-1 through 50-52 comprise first through 52nd memory cells 51-1, 51-2, and 51-52, each of which stores 1 bit data. The first through the 52nd memory cell blocks 50-1 through 50-52 comprise first through 52nd data latch circuits 52-1, 52-2, . . . , and 52-52 corresponding to the first through the 52nd memory cells 51-1 through 51-52, respectively. In a write (erasing/writing) operation of the nonvolatile memory circuit 50, the first through the 52nd data latch circuits 52-1 through 52-52 hold operation mode information with respect to the first through the 52nd memory cells 51-1 through 51-52, respectively. On the other hand, in a loading (reading) operation of the nonvolatile memory circuit 50, the first through the 52nd data latch circuits 52-1 through 52-52 hold data which are read from the first through the 52nd memory cells 51-1 through 52-52 [51-52], respectively.

The first through the 52nd memory cell blocks 50-1 through 50-52 comprise first through 52nd erase/write control circuits 53-1, 53-2, . . . , and 53-52 corresponding to the first through the 52nd memory cells 51-1 through 51-52, respectively. In the write (erasing/writing) operation of the nonvolatile memory circuit 50, with reference to the operation mode information held in the first through the 52nd data latch circuits 52-1 through 52-52, the first through the 52nd erase/write control circuits 53-1 through 53-52 switch erasing/writing operations of 1 bit data with respect to the first through the 52nd memory cells 51-1 through 51-52, respectively, as will later be described.

The first through the 52nd memory cell blocks 50-1 through 50-52 comprise first through 52nd input/output control circuits 54-1, 54-2, and 54-52 corresponding to the first through the 52nd memory cells 51-1 through 51-52, respectively. The first through the 52nd input/output control circuits 54-1 through 54-52 control inputs/outputs with respect to the first through the 52nd memory cells 51-1 through 51-52, respectively. In detail, in the loading (reading) operation of the nonvolatile memory circuit 50, the first through the 52nd input/output control circuits 54-1 through 54-52 perform control so that data read from the first through the 52nd memory cells 51-1 through 51-52 are delivered to the first through the 52nd data latch circuits 52-1 through 52-52, respectively.

Accordingly, a combination of the first through the 52nd erase/write control circuits 53-1 through 53-52 and the first through the 52nd input/output control circuits 54-1 through 54-52 serves as first through 52nd switching circuits for reading, when loading, 1 bit data with respect to each of the first through the 52nd memory cells 51-1 through 51-52 and for switching, when writing, erasing/writing operations with reference to the above-mentioned operation mode information.

The nonvolatile memory circuit 50 comprises a serial interface control circuit 68. The serial interface control circuit 68 controls the first through the 52nd input/output control circuits 54-1 through 54-52 in synchronization with a serial clock signal supplied from a serial clock input terminal SCLK.

Specifically, the first through the 52nd input/output control circuits 54-1 through 54-52 serve as first through 52nd serial transfer means which serially transfer, in cooperation with the serial interface control circuit 68, data to be inputted to the first through the 52nd memory cells 51-1 through 51-52, respectively.

Further, the nonvolatile memory circuit 50 comprises a voltage application terminal Vpp applying a voltage for erasing and writing of data. The voltage applied to the voltage application terminal Vpp is supplied to the first through the 52nd erase/write control circuits 53-1 through 53-52.

Figure 1:
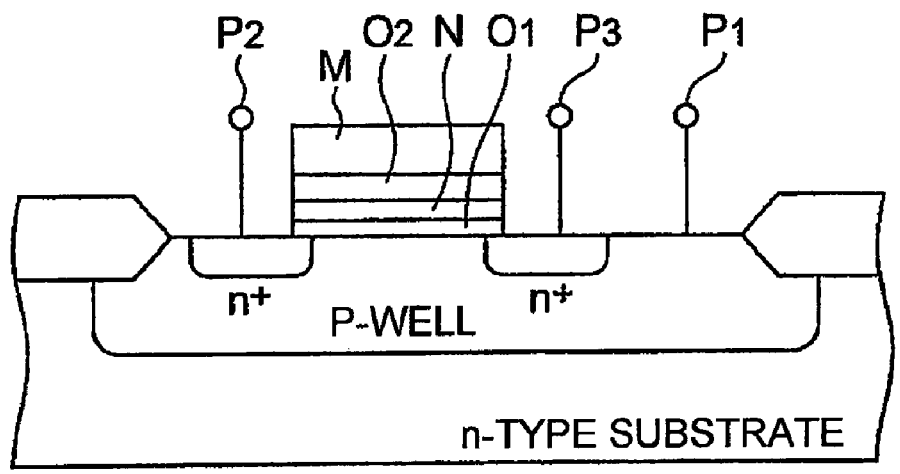
FIG. 1 is a sectional view and a circuit diagram showing a MONOS-type EEPROM for use as a memory cell of a nonvolatile memory circuit according to the present invention.
Figure 1:
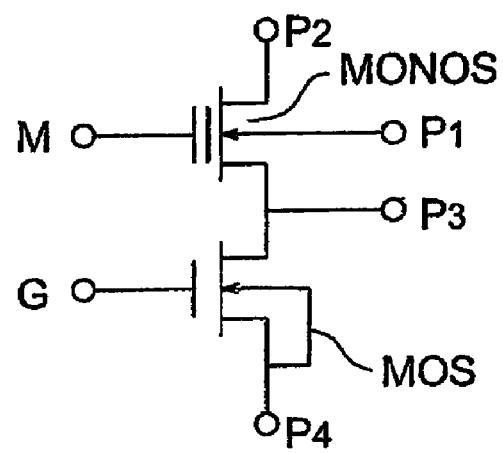
Figure 2:
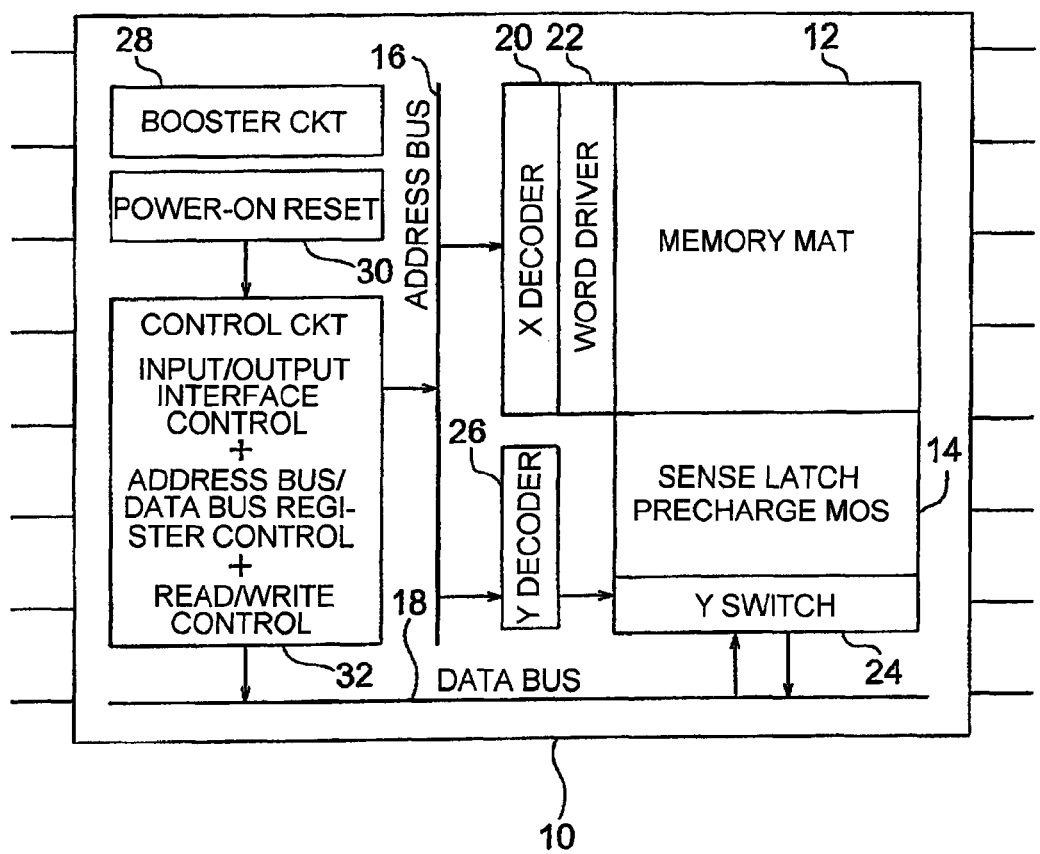
FIG. 2 is a block diagram showing a structure of a conventional EEPROM module.

As mentioned above, in the nonvolatile memory circuit 50 according to the present embodiment, a peripheral circuit function is included in the memory cell blocks 50-1 through 50-52 each having 1 bit. With this structure, a module area of the nonvolatile memory circuit 50 can be increased or decreased in proportion to a memory capacity. The nonvolatile memory circuit 50 employs an all memory batch selection method. Therefore, it is not necessary to specify a memory address. As a result, it is possible to omit the address bus 16, an address register, the XY decoders 20 and 26, the word driver 22, the Y switch 24, and a control logic related thereto, which are required in the conventional nonvolatile memory circuit 10 shown in FIG. 2. Further, in the nonvolatile memory circuit 50, a time for reading all memory data can be shortened by the all memory batch selection method. As a result, after power is turned on, loading of all memory data (reading of memory→transfer to register→output of data) is enabled in a short time period from start of an operation of the power-on reset circuit 64 to release of the operation.

In the nonvolatile memory circuit 50 according to the present embodiment, a conventional memory mat method of collecting a plurality of memory cells at one position is eliminated and the memory cells 51-1 through 51-52 are separately arranged on a bit-by-bit basis. Therefore, erasing and writing of all memories in a batch are possible. As mentioned above, erasing and writing of all memories in a batch are enabled. In addition, the erasing/writing operations can be switched by data latch information held in the data latch circuits 52-1 through 52-52 inside the memory cell blocks 50-1 through 50-52. As a result, in the nonvolatile memory circuit 50, the erasing/writing operations can be performed only by applying an electric voltage to the erasing/writing voltage application terminal Vpp. Thus, the control logic for generating a write timing and the internal oscillator 36 can be omitted.

In the nonvolatile memory circuit 50 according to the present embodiment, the memory cell blocks 50-1 through 50-52 have memory functions independent from one another on a bit-by-bit basis. Therefore, a layout design can be created only by combining those memory cell blocks corresponding to a required number of bits and adding the power-on reset circuit 64 and the power-on precharge circuit 66. Thus, the layout design can be created easily and in a short time. For example, the memory cell blocks 50-1 through 50-52 may also be arranged separately on the bit-by-bit basis.

Figure 7:
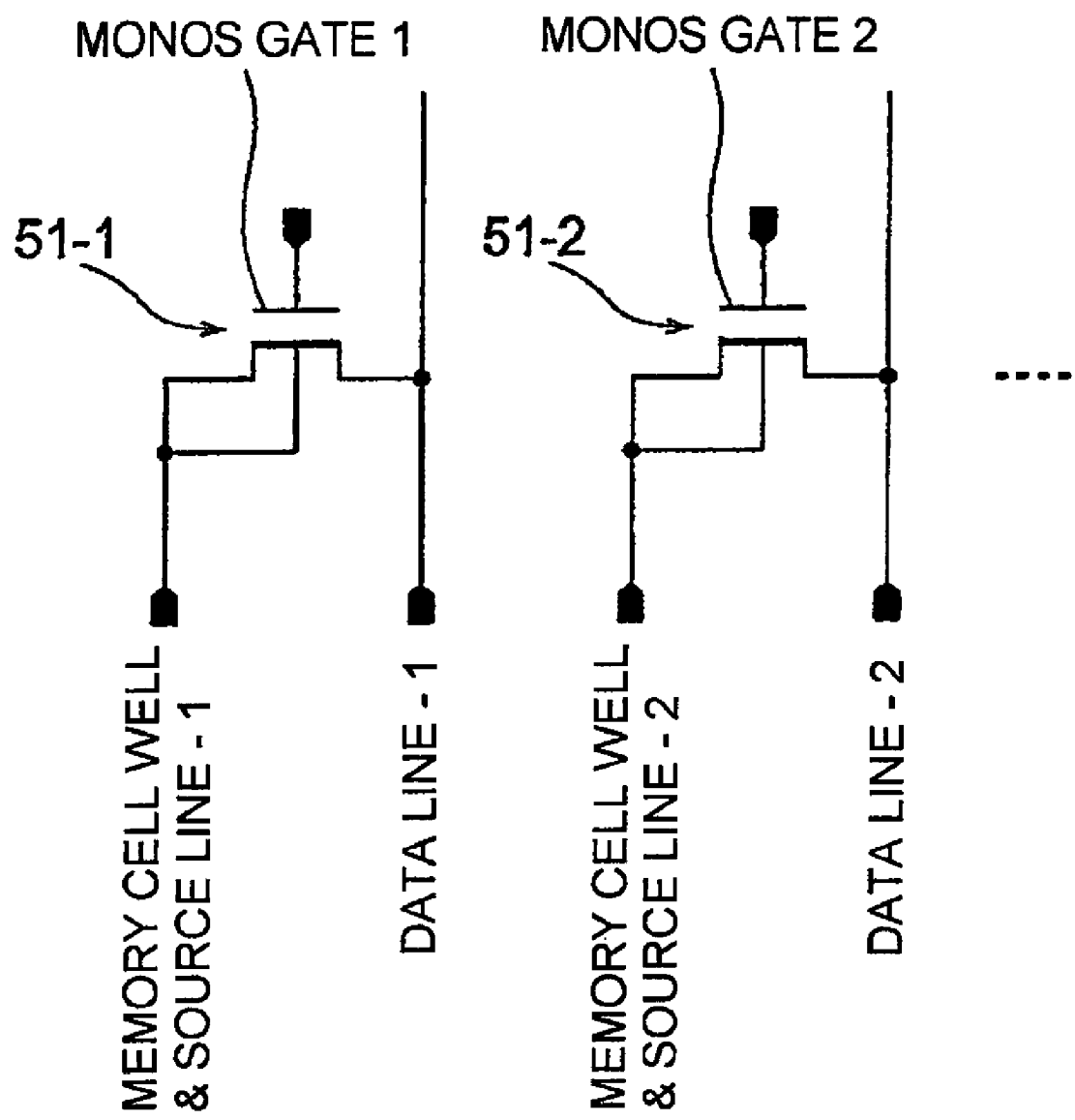
FIG. 7 is a circuit diagram showing a memory cell for use in the nonvolatile memory circuit shown in FIG. 6.

FIG. 7 shows the first and the second memory cells 51-1 and 51-2 for use in the nonvolatile memory circuit 50 in FIG. 6. Each of the first and the second memory cells 51-1 and 51-2 comprises a MONOS transistor.

Referring to FIG. 7 in addition to FIG. 6, an operation of the nonvolatile memory circuit 50 will be described. First, description will be made of an operation at the time of reading a trimming memory when power is turned on.

A control circuit (not shown in the figure) makes a MONOS gate have 0V. Simultaneously, the control circuit makes a memory cell well and a source line have 0V. The power-on precharge circuit 66 precharges a data line at a Vcc level. After lapse of a fixed time period (after completion of precharge), the control circuit brings the data line into a floating state.

Herein, when the MONOS gate has 0V, the MONOS transistor after erasure is in an on state. Therefore, the level of the data line of the MONOS transistor after erasure is changed from Vcc to 0V. Specifically, the MONOS transistor after erasure has "0" data. On the other hand, when the MONOS gate has 0V, the MONOS transistor after writing is in an off state. Accordingly, the MONOS transistor after writing maintains the level (Vcc) of the data line. Specifically, the MONOS transistor after writing has "1" data.

After lapse of a fixed time period (after completion of reading memory data), the first through the 52nd input/output control circuits 54-1 through 54-52 load information of data lines of the first through the 52nd memory cells 51-1 through 51-52 into the first through the 52nd data latch circuits 52-1 through 52-52, respectively.

Next, a rewriting (erasing/writing) operation of the trimming memory will be described. In a case of the nonvolatile memory circuit (EEPROM module) 50 of the present invention, the memory cell wells are separated on a bit-by-bit basis, as shown in FIG. 7. Therefore, for the rewriting operation of memory data, writing (erasing) of "0" data/writing of "1" data can be processed in a batch.

In response to data supplied from a data input/output terminal DIO, the first through the 52nd input/output control circuits 54-1 through 54-52 write, into the first through the 52nd data latch circuits 52-1 through 52-52, those data (rewriting data and the operation mode information) which are to be written into the first through the 52nd memory cells 51-1 through 51-52, respectively. The above-mentioned data latch to the data latch circuits is carried out on the all-bit basis in the present example (first embodiment) but is carried out on a byte-by-byte basis in modifications (a second embodiment and a third embodiment) which will later be described. At this time, latched data written in the above-mentioned loading operation (reading of the trimming memory when power is turned on) is partly rewritten (overwritten).

Next, erasing/writing operations will be described. First, description will be made of a case where a memory cell to be written with "0" data is erased ("0" is written). In this case, according to the data of the data latch, the MONOS gate is kept at Vcc-13V and the source line is kept at Vcc. As a result, the memory cell in which "0" is to be written is erased. A Vpp level is applied from the outside for 4 milliseconds and this state is maintained. Next, description will be made about a case of writing "1" data in a memory cell in which the "1" data is to be written. In this case, according to the data of the data latch, the MONOS gate is kept at Vcc and the source line is kept at Vcc-13V. As a result, the "1" data is written in the memory cell in which the "1" data is to be written. The Vpp level is applied from the outside for 4 milliseconds and this state is maintained.

Then, the erasing/writing operations are terminated. In detail, the Vpp level is turned into 0V from the outside (a state except writing/erasing).

Figure 8:
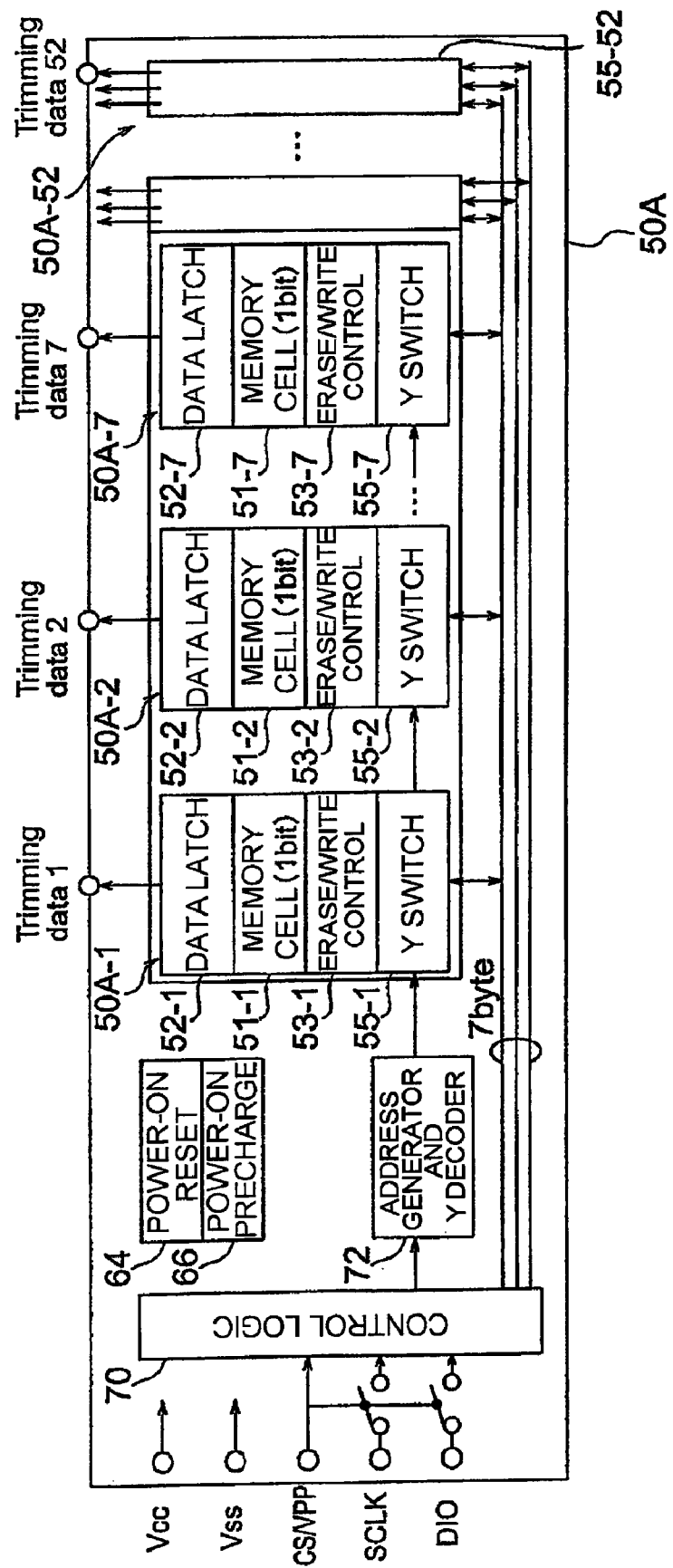
FIG. 8 is a block diagram showing a nonvolatile memory circuit according to a second embodiment of the present invention.

Referring to FIG. 8, a nonvolatile memory circuit 50A according to a second embodiment of the present invention will be described. The illustrated nonvolatile memory circuit 50A is similar in structure to the nonvolatile memory circuit 50 shown in FIG. 6 except that the serial interface circuit 68 is replaced by a control logic circuit 70 and an address generator and Y decoder 72 and that the first through the 52nd memory cell blocks are modified as will later be described. Accordingly, the first through the 52nd memory cell blocks are designated by reference numerals 50A-1 through 50A-52. Parts similar in function to those shown in FIG. 6 are designated by the same reference numerals and description thereof will be omitted for simplification of description.

The first through the 52nd memory cell blocks 50A-1 through 50A-52 are similar in structure to the first through the 52nd memory cell blocks 50-1 through 50-52 illustrated in FIG. 6 except that the first through the 52nd input/output control circuits 54-1 through 54-52 are replaced by first through 52nd Y switches 55-1 through 55-52 connected to the address generator and Y decoder 72.

The nonvolatile memory circuit 50A comprises the address generator and Y decoder 72 and the first through the 52nd Y switches 55-1 through 55-52. Therefore, latch of rewriting data (operation mode information) into the first through the 52nd data latch circuits 52-1 through 52-52 can be carried out on a byte-by-byte basis (on seven bits basis in the present embodiment).

Like the nonvolatile memory circuit 50 shown in FIG. 6, the nonvolatile memory circuit 50A according to the present embodiment is applied with a voltage for data erasing and writing from the outside via a voltage application terminal CS/VPP.

The nonvolatile memory circuit 50A employs the all memory batch selection method. Therefore, it is not necessary to specify a memory address. As a result, it is possible to omit the address bus 16, the address register, the X decoder 20, the word driver 22, and the control logic related thereto, which are required in the conventional nonvolatile memory circuit 10 shown in FIG. 2. In the nonvolatile memory circuit 50A, a time for reading all memory data can be shortened by the all memory batch selection method. As a result, after power is turned on, loading of all memory data (reading of memory→transfer to register→output of data) is enabled in a short time period from start of an operation of the power-on reset circuit 64 to release of the operation.

In the nonvolatile memory circuit 50A according to the present embodiment, the conventional memory mat method of collecting a plurality of memory cells at one position is eliminated and the memory cells 51-1 through 51-52 are separately arranged on a bit-by-bit basis. Therefore, erasing and writing of all memories in a batch are possible. As mentioned above, erasing and writing of all memories in a batch are enabled. In addition, the erasing/writing operations can be switched by data latch information held in the data latch circuits 52-1 through 52-52 inside the memory cell blocks 50A-1 through 50A-52. As a result, in the nonvolatile memory circuit 50A, the erasing/writing operations can be performed only by applying a voltage to the erasing/writing voltage application terminal CS/VPP. Thus, the internal oscillator 36 can be omitted.

Figure 9:
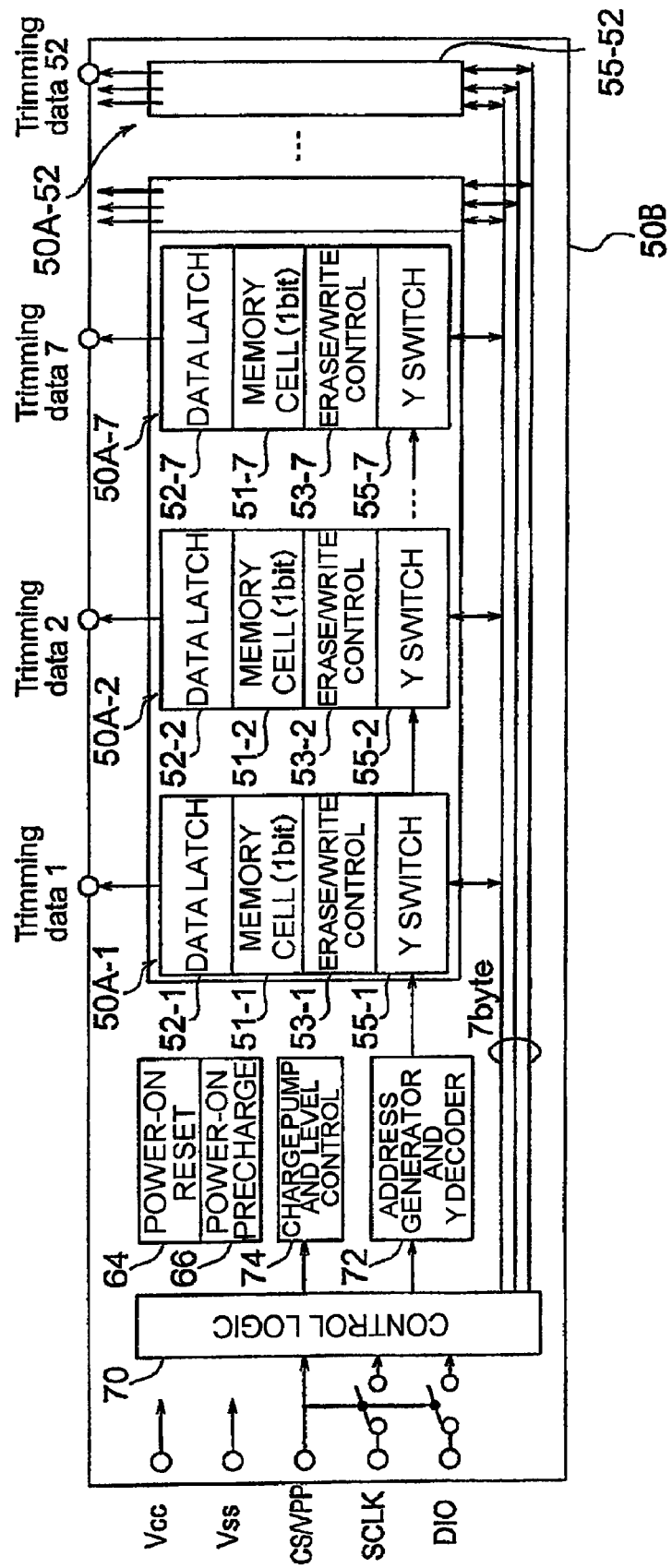
FIG. 9 is a block diagram showing a nonvolatile memory circuit according to a third embodiment of the present invention.

Referring to FIG. 9, a nonvolatile memory circuit 50B according to a third embodiment of the present invention will be described. The illustrated nonvolatile memory circuit 50B is similar in structure to the nonvolatile memory circuit 50A shown in FIG. 8 except that a charge pump and level control circuit 74 is added. Parts similar in function to those shown in FIG. 8 are designated by the same reference numerals and description thereof will be omitted for simplification of description.

The charge pump and level control circuit 74 generates a boost voltage for erasing and writing of data.

The nonvolatile memory circuit 50B employs the all memory batch selection method. Therefore, it is not necessary to specify a memory address. As a result, it is possible to omit the address bus 16, the address register, the X decoder 20, the word driver 22, and the control logic related thereto, which are required in the conventional nonvolatile memory circuit 10 shown in FIG. 2. In the nonvolatile memory circuit 50B, a time for reading all memory data can be shortened by the all memory batch selection method. As a result, after power is turned on, loading of all memory data (reading of memory→transfer to register→output of data) is enabled in a short time period from start of an operation of the power-on reset circuit 64 to release of the operation.

In the nonvolatile memory circuit 50B according to the present embodiment, the conventional memory mat method of collecting a plurality of memory cells at one position is eliminated and the memory cells 51-1 through 51-52 are separately arranged on a bit-by-bit basis. Therefore, erasing and writing of all memories in a batch are possible. As mentioned above, erasing and writing of all memories in a batch are enabled. In addition, the erasing/writing operations can be switched by data latch information held in the data latch circuits 52-1 through 52-52 inside the memory cell blocks 50A-1 through 50A-52. As a result, in the nonvolatile memory circuit 50B, the erasing/writing operations can be performed by the boost voltage generated by the charge pump and level control circuit 74. Thus, the internal oscillator 36 can be omitted.

Figure 10:
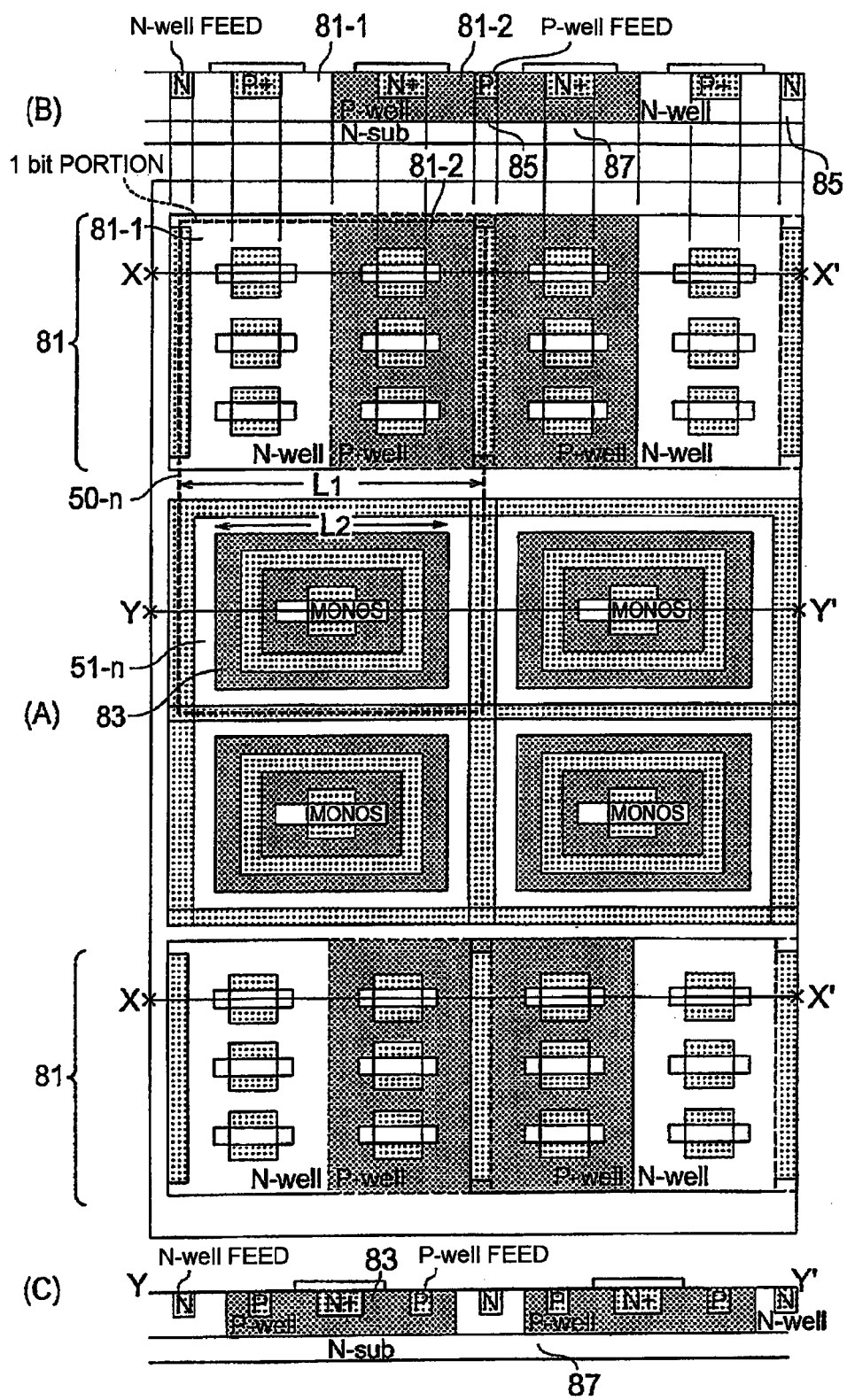
FIG. 10 is a view showing a layout and a vertical structure of the nonvolatile memory circuit shown in FIG. 6.

Referring to FIG. 10, a layout and a vertical structure of the nonvolatile memory circuit 50 shown in FIG. 6 will be described.

In the n-th ($1 \leq n \leq 52$) memory cell block 50-n, a peripheral circuit region 81 including the n-th data latch circuit 52-n and the n-th switching circuit (53-n and 54-n) is formed in an area where a generally-rectangular first well region (N-well) 81-1 of a first conductivity type and a generally-rectangular second well region (P-well) 81-2 of a second conductivity type are adjacent to each other.

The n-th memory cell 51-n is formed in a third well region (P-well) 83 of the first or the second conductivity type, which is independent from the peripheral circuit region 81. The third well region 83 provided with the n-th memory cell 51-n is formed adjacent to the peripheral circuit region 81 in its long side direction. The third well region 83 provided with the n-th memory cell 51-n has a width $L_2$ which is smaller than a length $L_1$ of a short side of the peripheral circuit region 81.

The peripheral circuit regions 81 adjacent to each other are arranged symmetrically with respect to the long side. The peripheral circuit regions 81 adjacent to each other have an adjacent area 85 which is a common well region.

As mentioned above, it is understood that the memory cell blocks 50-1 through 50-52 are independent from one another in memory function on a bit-by-bit basis.

Figure 11:
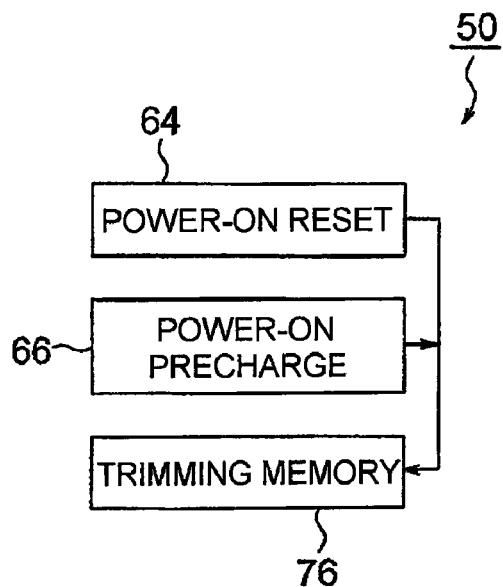
FIG. 11 is a block diagram showing the nonvolatile memory circuit (semiconductor integrated circuit device) according to the present invention, in which only a part necessary for power-on read in the nonvolatile memory circuit shown in FIG. 6 is extracted.

FIG. 11 shows the nonvolatile memory circuit (semiconductor integrated circuit device) 50 according to the present invention. In the nonvolatile memory circuit 50 shown in FIG. 11, only a part necessary for power-on read in the nonvolatile memory circuit 50 shown in FIG. 6 is extracted.

Figure 3:
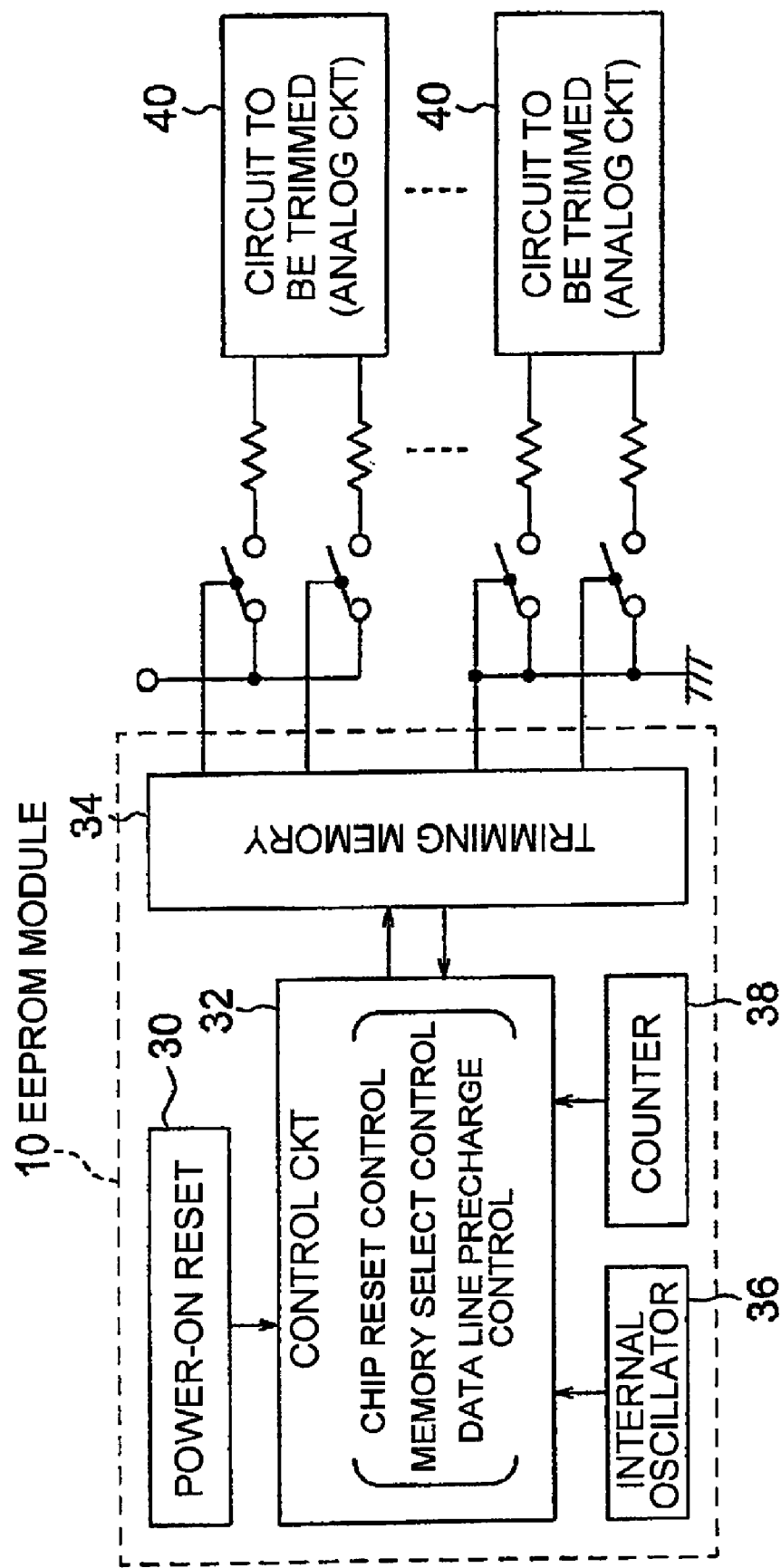
FIG. 3 is a block diagram showing the EEPROM module (semiconductor integrated circuit device) together with circuits to be trimmed, in which only a part necessary for power-on read in the EEPROM module shown in FIG. 2 is extracted.
Figure 4:
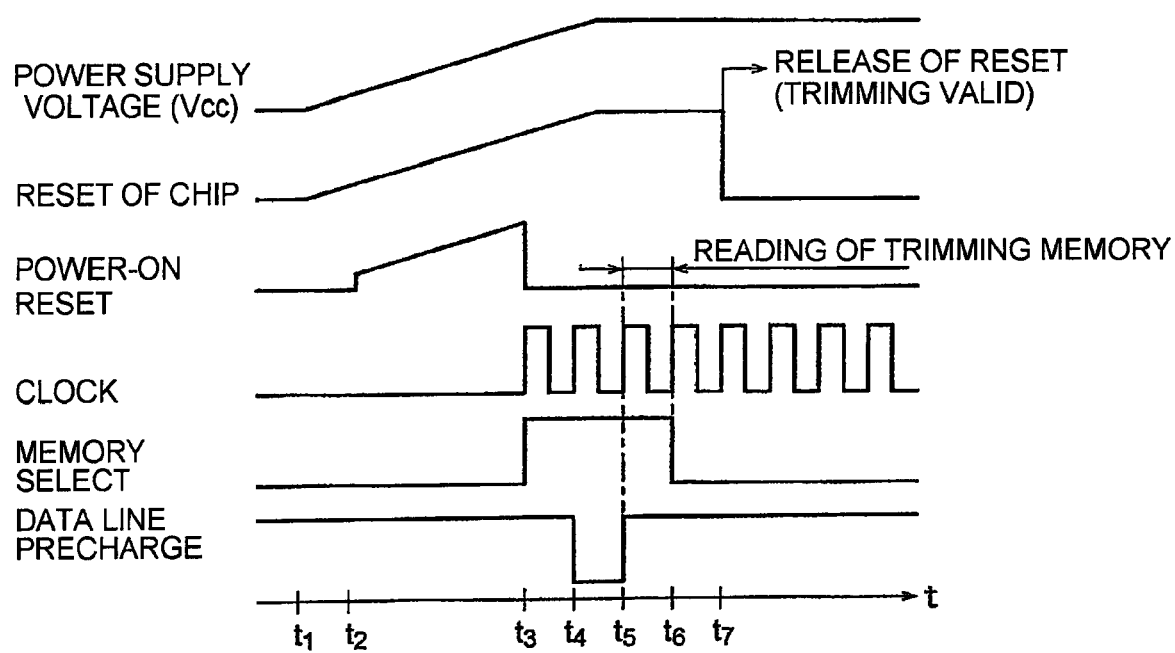
FIG. 4 is a time chart (waveform diagram) for describing an operation of the EEPROM module (semiconductor integrated circuit device) shown in FIG. 3.
Figure 5:
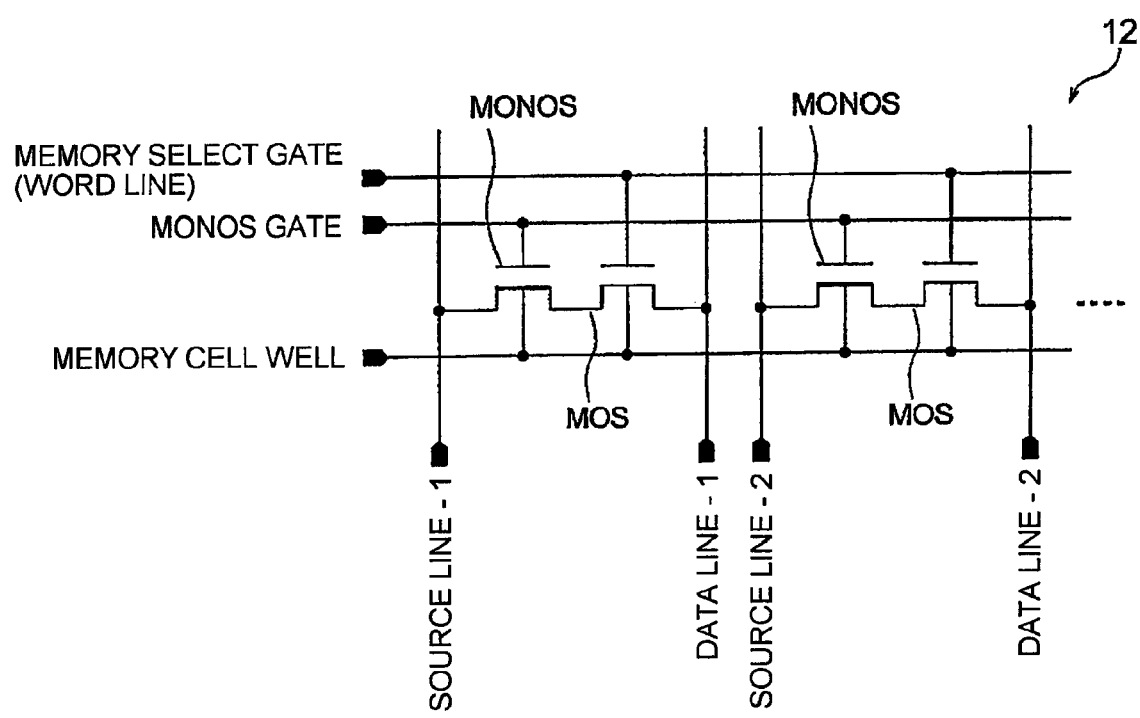
FIG. 5 is a circuit diagram showing a memory cell for use in a memory mat in the conventional EEPROM module shown in FIG. 2.

The illustrated nonvolatile memory circuit (semiconductor integrated circuit device) 50 comprises a trimming memory 76, the power-on reset circuit 64, and the power-on precharge circuit 66. The trimming memory 76 corresponds to the first through the 52nd memory cell blocks 50-1 through 50-52 in FIG. 6. Specifically, the nonvolatile memory circuit 50 is a circuit obtained by omitting the internal oscillator 36, the counter 38, and the control circuit 32 from the conventional EEPROM module 10 (FIG. 3) and replacing these components by the power-on precharge circuit 66.

The trimming memory 76 is a nonvolatile memory which stores trimming information and performs a reading operation of the trimming information after completion of data line precharge. Both of the power-on reset circuit 64 and the power-on precharge circuit 66 start an operation in response to power-on. The reading operation of the trimming information from the trimming memory 76 is completed in a period after the completion of the data line precharge operation and before release of power-on reset.

The trimming memory 76, the power-on reset circuit 64, and the power-on precharge circuit 66 are formed on the same semiconductor substrate 87 (see FIG. 10). The power-on reset circuit 64 and the power-on precharge circuit 66 have circuit structures substantially identical to each other on the semiconductor substrate 87, as will later be described.

Figure 12:
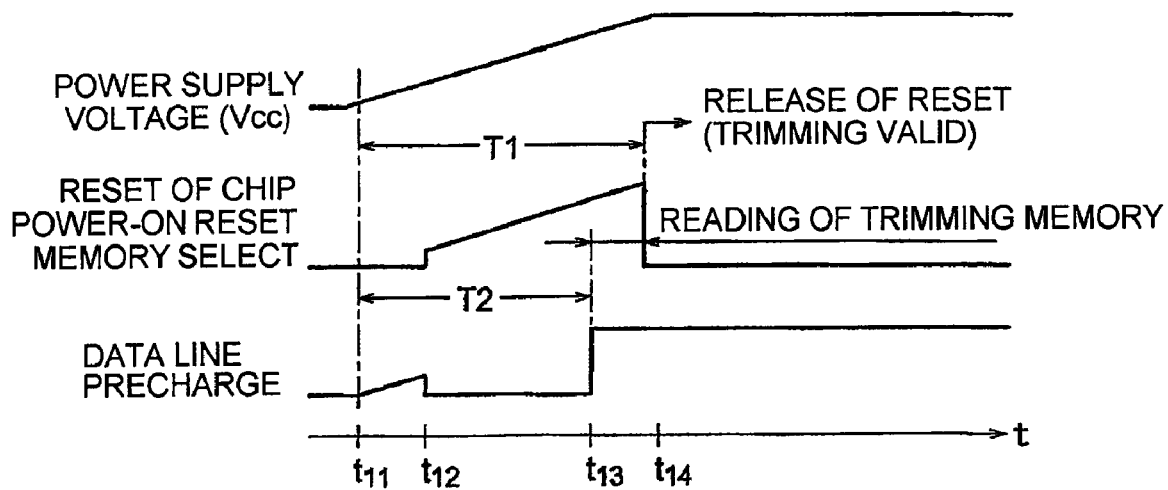
FIG. 12 is a time chart (waveform diagram) for describing an operation of the nonvolatile memory circuit (semiconductor integrated circuit device) shown in FIG. 11.

Referring to FIG. 12, description will be made about a reading operation of the nonvolatile memory circuit (semiconductor integrated circuit device) 50 shown in FIG. 11. In FIG. 12, a first line shows a waveform of a power supply voltage (Vcc), a second line shows a waveform of an output signal of the power-on reset circuit 64, and a third line shows a waveform of an output signal (data line precharge signal) of the power-on precharge circuit 66. In the present embodiment, the output signal of the power-on reset circuit 64 combines a chip reset signal, a power-on reset signal, and a memory select signal.

As will later be described, the power-on reset circuit 64 has a first predetermined time period T1 and the power-on precharge circuit 66 has a second predetermined time period T2. The first predetermined time period T1 is longer than the second predetermined time period T2.

It is assumed that, at first, power is turned on at a time instant $t_{11}$. As a result, the power supply voltage (Vcc) is gradually increased from the time instant $t_{11}$. From the time instant $t_{11}$ when power is turned on, the power-on reset circuit 64 and the power-on precharge circuit 66 start an operation. Accordingly, from the time instant $t_{11}$, the data line precharge signal which is the output signal of the power-on precharge circuit 66 is gradually increased.

At a time instant $t_{12}$ after lapse of a predetermined time period from the time instant $t_{11}$, the output signal of the power-on reset circuit 64 is gradually increased and the output signal (data line precharge signal) produced from the power-on precharge circuit 66 is shifted to a low level. As a result, from the time instant $t_{12}$, precharge of the data line of the trimming memory 76 is performed.

At a time instant $t_{13}$ after lapse of the second predetermined time period T2 from the time instant $t_{11}$, the power-on precharge circuit 66 shifts the data line precharge signal from the low level to a high level. At the time point $t_{13}$, precharge of the data line is completed. In response to the rise of the data line precharge signal, the reading operation of the trimming information from the trimming memory 76 is started.

At a time point $t_{14}$ after lapse of the first predetermined time period T1 from the time instant $t_{11}$, the output signal of the power-on reset circuit 64 is shifted from the high level to the low level. By the time point $t_{14}$, the reading operation of the trimming information from the trimming memory 76 is completed. Therefore, at the time instant $t_{14}$, chip reset, power-on reset, and memory selection are released and a trimming value represented by the trimming information is enabled or validated.

As mentioned above, in the present embodiment, the power-on precharge circuit 66, which is low in power-on determining voltage and short in power-on signal active period (time) with respect to the power-on reset circuit 64, is combined with the power-on reset circuit 64. Thus, a power-on read control circuit is constructed.

In the nonvolatile memory circuit (semiconductor integrated circuit device) 50 having the above-mentioned structure, the trimming information can be read from the trimming memory 76 immediately after power-on. Therefore, a chip reset period (time) can be shortened. Further, by adding the power-on precharge circuit 66 having a size approximately same as that of the power-on reset circuit 64, it is unnecessary to provide the internal oscillator 36 (or an external clock input terminal), the counter 38, and the control circuit 32 which are required in the conventional EEPROM module 10. Consequently, as compared to the conventional EEPROM module 10, the nonvolatile memory circuit (semiconductor integrated circuit device) 50 can be reduced in module size by 50% or more.

Figure 13:
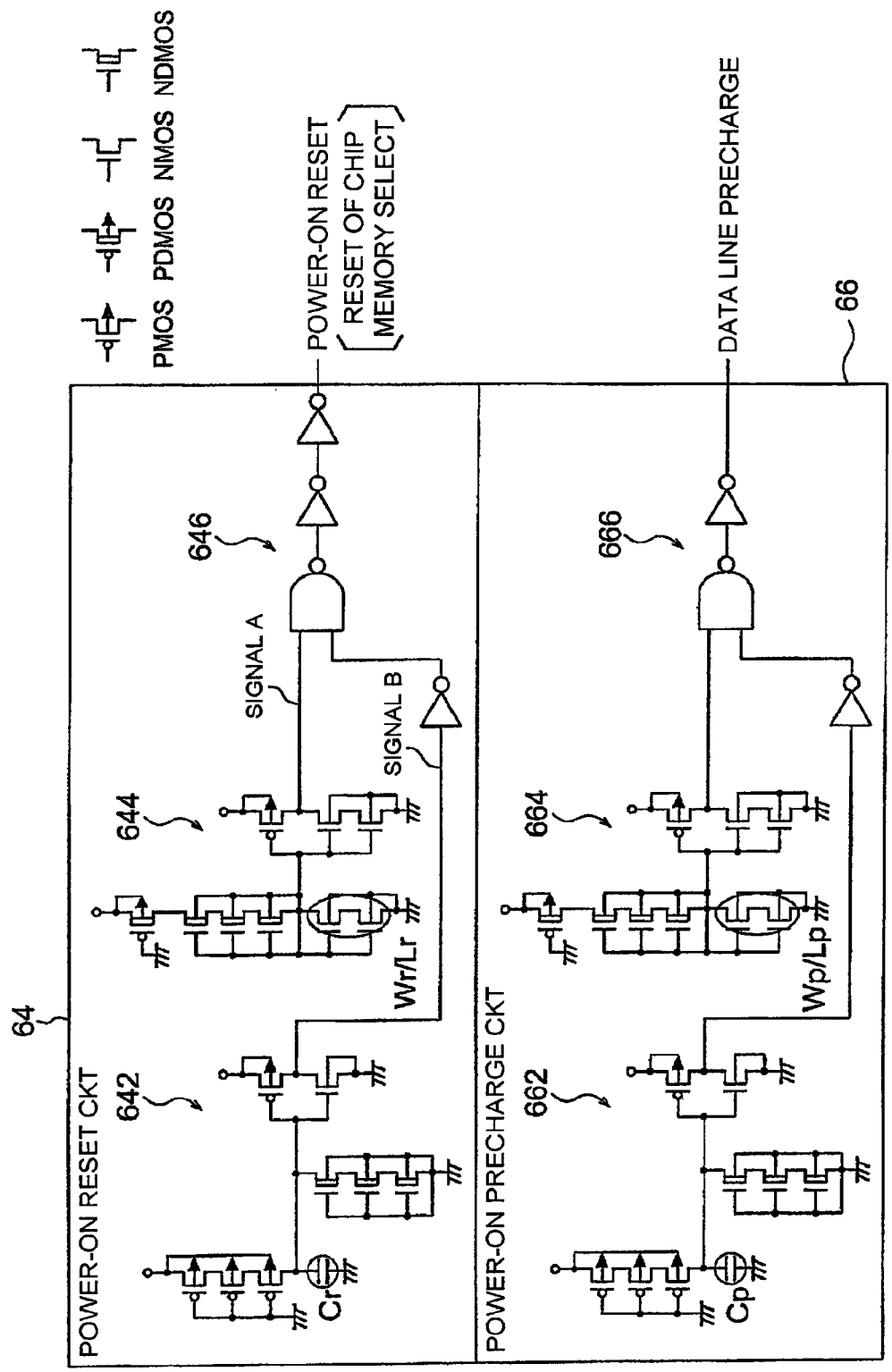
FIG. 13 is a circuit diagram showing a circuit example of a power-on reset circuit and a power-on precharge circuit which are for use in the nonvolatile memory circuit (semiconductor integrated circuit device) shown in FIG. 11.

FIG. 13 shows a circuit example of the power-on reset circuit 64 and the power-on precharge circuit 66 for use in the nonvolatile memory circuit (semiconductor integrate circuit device) 50 shown in FIG. 11.

The illustrated power-on reset circuit 64 comprises a first CR operation circuit 642, a first DC operation circuit 644, and a first logic circuit 646. Similarly, the illustrated power-on precharge circuit 66 comprises a second CR operation circuit 662, a second DC operation circuit 664, and a second logic circuit 666.

As shown in FIG. 13, the first CR operation circuit 642, the first DC operation circuit 644, the second CR operation circuit 662, and the second DC operation circuit 664 are constructed by PMOS transistors, PDMOS transistors, NMOS transistors, and NDMOS transistors.

First, the power-on reset circuit 64 will be described. An inclination of a power supply voltage when power is turned on becomes steep or moderate depending on use conditions of customers. In order to make the power-on reset circuit 64 produce a power-on reset signal under any use conditions, the power-on reset circuit 64 is constructed by the first CR operation circuit 642 and the first DC operation circuit 644 as shown in FIG. 13. Specifically, one of the first CR operation circuit 642 and the first DC operation circuit 644 is operated so that the power-on reset circuit 64 produces the power-on reset signal, as will later be described.

Figure 14:
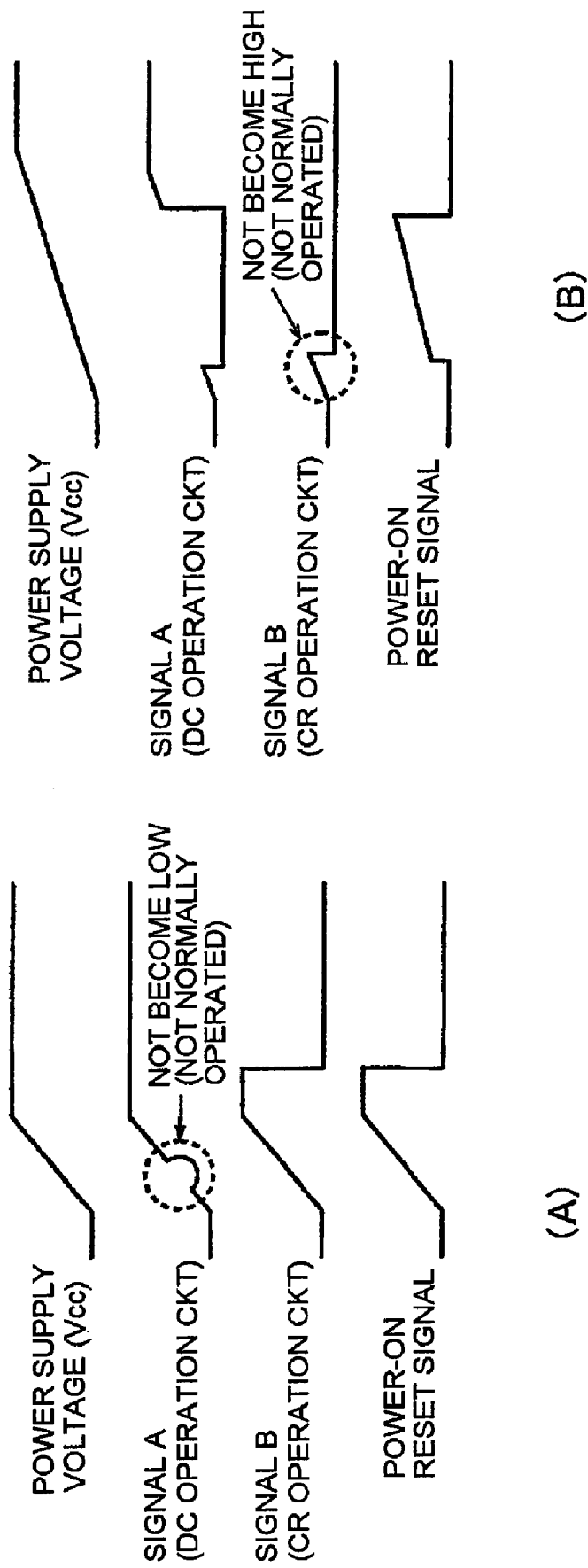
FIG. 14 is waveform diagrams for describing an operation of the power-on reset circuit shown in FIG. 13.

FIG. 14 shows waveform diagrams for describing an operation of the power-on reset circuit 64. In FIG. 14, (A) shows a waveform when the power supply voltage Vcc has a steep inclination during transition, while (B) shows a waveform when the power supply voltage Vcc has a moderate inclination during transition. It is noted here that an output signal of the first DC operation circuit 644 is represented by a signal A and an output signal of the first CR operation circuit 642 is represented by a signal B.

The first DC operation circuit 644 is a circuit which is enabled when the power supply voltage Vcc has a moderate inclination during transition. As shown in FIG. 14 (A), when the power supply voltage Vcc during transition has a steep inclination, the first DC operation circuit 644 may not be normally operated. In the course of change of the power supply voltage Vcc during transition from 0V to a steady-state Vcc level (at a voltage slightly lower than the power supply voltage Vcc in a steady state), the output signal A of the first DC operation circuit 644 is shifted from a L level to a H level as shown in FIG. 14 (B). Consequently, as shown in FIG. 14 (B), the power-on reset signal produced from the power-on reset circuit 64 is shifted from a H level to a L level and power-on reset is released.

On the other hand, the first CR operation circuit 642 is a circuit which is enabled when the power supply voltage Vcc during transition has a steep inclination. As shown in FIG. 14 (B), when the power supply voltage Vcc during transition has an extremely moderate inclination, the first CR operation circuit 642 may not be normally operated. In the course of change of the power supply voltage Vcc during transition from 0V to the steady-state Vcc level (after lapse of time corresponding to a time constant defined by a CR constructing the first CR operation circuit 642), the output signal B of the first CR operation circuit 642 is shifted from a H level to a L level as shown in FIG. 14 (A). Consequently, as shown in FIG. 14 (A), the power-on reset signal produced from the power-on reset circuit 64 is shifted from a H level to a L level. Thus, power-on reset is released.

Therefore, a combination of the first CR operation circuit 642 and the first DC operation circuit 644 enables the power-on reset circuit 64 to normally produce the power-on reset signal with respect to any inclination of the power supply voltage Vcc during transition.

Next, the power-on precharge circuit 66 will be described. As shown in FIG. 13, as compared to the power-on reset circuit 64, the power-on precharge circuit 66 is exactly identical in circuit structure to the power-on reset circuit 64 except that the second logic circuit 666 has inverters less in number by one than those of the first logic circuit 646. Accordingly, the operation itself of the power-on precharge circuit 66 is substantially same as that of the power-on reset circuit 64. In other words, the data line precharge signal produced from the power-on precharge circuit 66 is a signal inverted in logic (H level/L level) with respect to the power-on reset signal produced from the power-on reset circuit 64.

Next, referring to FIG. 13, the power-on precharge circuit 66 will be described in detail, in comparison with the power-on reset circuit 64.

As is clear from FIG. 13, the first CR operation circuit 642 and the second CR operation circuit 662 are substantially identical to each other in circuit structure. Specifically, the first CR operation circuit 642 and the second CR operation circuit 662 are constructed by the same kinds of circuit elements. A difference between the first CR operation circuit 642 and the second CR operation circuit 662 is that a capacitor Cr constructing the first CR operation circuit 642 has a capacitance value greater than that of a capacitor Cp constructing the second CR operation circuit 662 (Cr>Cp).

As shown in FIG. 12, the first CR operation circuit 642 produces a first reset release signal indicative of change of a voltage level at the time point $t_{14}$ after lapse of the first predetermined time period T1 from the time point $t_{11}$ when power is turned on. The second CR operation circuit 662 produces a first precharge completion signal indicative of change of the voltage level at the time point $t_{13}$ after lapse of the second predetermined time period T2 from the time point $t_{11}$ when power is turned on. As mentioned in the foregoing, the first predetermined time period T1 is longer than the second predetermined time period T2. In other words, the first CR operation circuit 642 has a time constant greater than that of the second CR operation circuit 662.

The first and the second CR operation circuits 642 and 662 are effective when the rise of the power supply voltage Vcc during transition is comparatively steep.

As is clear from FIG. 13, similarly, the first DC operation circuit 644 and the second DC operation circuit 664 are substantially identical to each other in circuit structure. Specifically, the first DC operation circuit 644 and the second DC operation circuit 664 are constructed by the same kinds of circuit elements. A difference between the first DC operation circuit 644 and the second DC operation circuit 664 is that Channel Width/Channel Length (Wr/Lr) of the NMOS transistor constructing the first DC operation circuit 644 is smaller than Channel Width/Channel Length (Wp/Lp) of the NMOS transistor constructing the second DC operation circuit 664. In other words, the channel length Lr of the NMOS transistor constructing the first DC operation circuit 644 is longer than the channel length Lp of the NMOS transistor constructing the second DC operation circuit 664 (Lr>Lp).

In response to power-on, the first DC operation circuit 644 produces a second reset release signal at a stage when the power supply voltage Vcc during transition reaches a first predetermined voltage. In response to power-on, the second DC operation circuit 664 produces a second precharge completion signal at a stage when the power supply voltage Vcc during transition reaches a second predetermined voltage. The first predetermined voltage is higher than the second predetermined voltage.

The first and the second DC operation circuits 644 and 664 are effective when the rise of the power supply voltage Vcc during transition is comparatively moderate.

The first logic circuit 646 performs a logical operation between the output signal B of the first CR operation circuit 642 and the output signal A of the first DC operation circuit 644 to produce the power-on reset signal. The illustrated first logic circuit 646 comprises three inverter gates and one NAND gate. In the present embodiment, the power-on reset signal is also used as a chip reset signal and a memory select signal.

The second logic circuit 666 performs a logical operation between an output signal of the second CR operation circuit 662 and an output signal of the second DC operation circuit 664 to produce the data line precharge signal. The illustrated second logic circuit 666 comprises two inverter gates and one NAND gate.

The power-on reset circuit 64 and the power-on precharge circuit 66 are varied in characteristic not only depending on a power supply voltage, an ambient temperature, and a manufacturing process but also depending on the inclination at the rise of the power supply voltage Vcc during transition. In view of the above, the present embodiment uses a combination of two pairs of power-on operation circuits such that those circuits in each pair have the same circuit structure and are different only in determining voltage at power-on and in active period (time) of the power-on signal. With this structure, variation in characteristic with respect to the inclination at the rise of the power supply voltage Vcc during transition is reduced.

Figure 15:
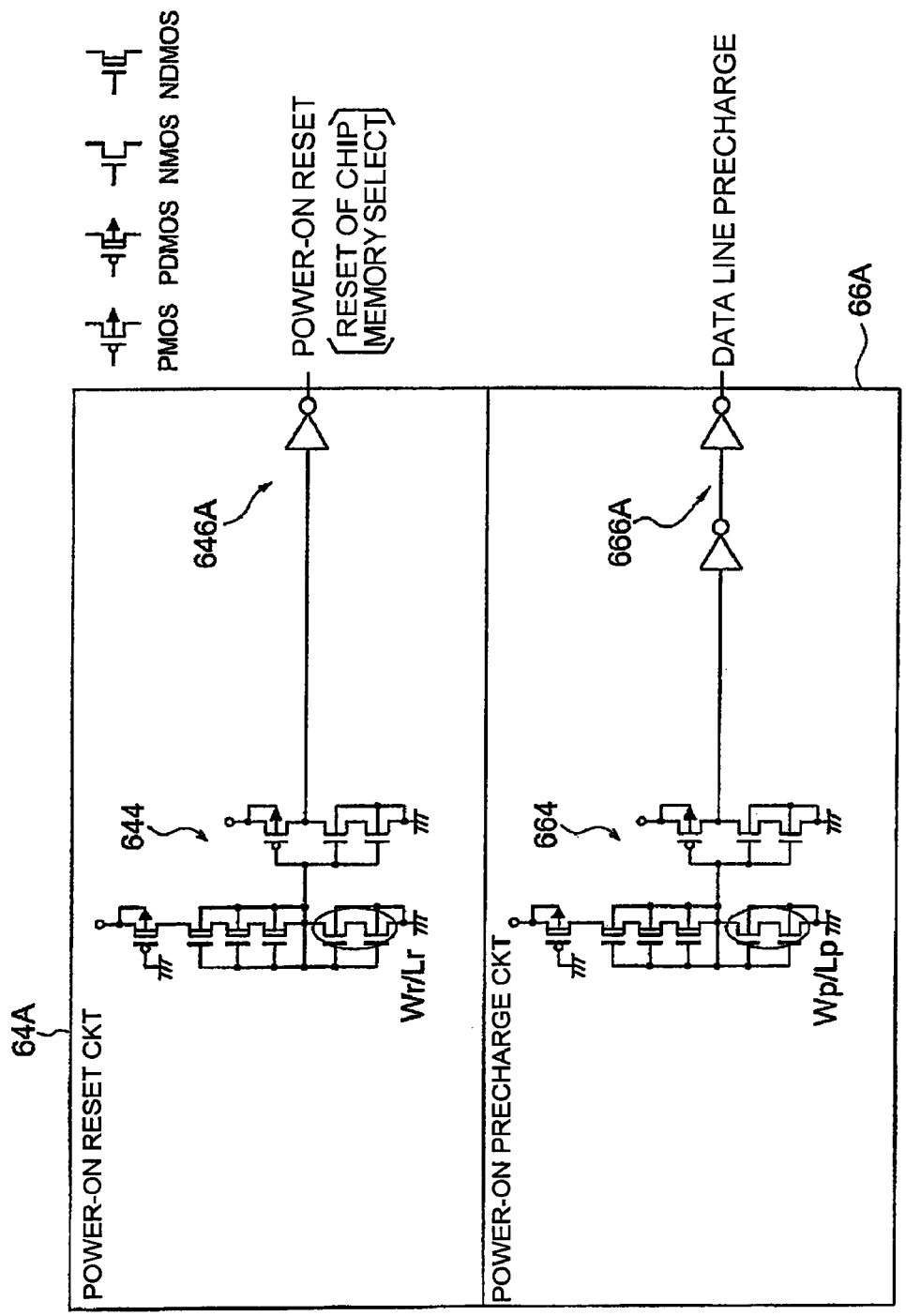
FIG. 15 is a circuit diagram showing another circuit example of the power-on reset circuit and the power-on precharge circuit which are for use in the nonvolatile memory circuit (semiconductor integrated circuit device) shown in FIG. 11.

Referring to FIG. 15, illustration is made of another circuit example of a power-on reset circuit 64A and a power-on precharge circuit 66A which are for use in the nonvolatile memory circuit (semiconductor integrated circuit device) 50 shown in FIG. 11.

The illustrated power-on reset circuit 64A comprises the first DC operation circuit 644 and a first logic circuit 646A. Similarly, the illustrated power-on precharge circuit 66A comprises the second DC operation circuit 664 and a second logic circuit 666A.

Specifically, the power-on reset circuit 64A substantially corresponds to a circuit obtained by omitting the first CR operation circuit 642 from the power-on reset circuit 64 shown in FIG. 13. The power-on precharge circuit 66A substantially corresponds to a circuit obtained by omitting the second CR operation circuit 662 from the power-on precharge circuit 66 shown in FIG. 13.

The first logic circuit 646A comprises one inverter gate while the second logic circuit 666A comprises two inverter gates.

The power-on reset circuit 64A and the power-on precharge circuit 66A of the present example are useful in case where an inclination period at the rise of a power supply voltage during transition is 10 μsec or more and can be identified.

In the foregoing, the present invention has been described in connection with the preferred embodiments. However, it is readily understood that the present invention is not limited to the above-mentioned embodiments. For example, if OTP is acceptable as a specification of the memory, a memory element (memory cell) may be changed from the EEPROM to an electric fuse ROM. The electric fuse ROM is formed of polysilicon and, therefore, can be manufactured in a typical process so that a unit cost of a wafer can be reduced as compared to the EEPROM. In a case where an electrical fuse is fused (cut), a fusing voltage of approximately 8 to 9 V is applied from the outside to the electrical fuse. When the memory element is replaced by the electric fuse ROM, a selection switch which is used in the EEPROM to switch erasing/writing of the memory element is changed to a selection switch for switching cutting/no cutting of the electrical fuse so as to deal with the replacement. Further, the memory element (memory cell) may be replaced from the EEPROM to a diode short-circuited ROM.

The invention claimed is:

1. A semiconductor integrated circuit device (50) comprising a nonvolatile memory (76) which stores trimming information and performs a reading operation of the trimming information after completion of precharge of a data line; and a power-on reset circuit (64; 64A) which starts an operation in response to power-on to reset a control circuit of the nonvolatile memory, the semiconductor integrated circuit device further comprising:
   a power-on precharge circuit (66; 66A) which starts an operation in response to the power-on to precharge the data line of the nonvolatile memory;
   the reading operation of the trimming information from the nonvolatile memory (76) being completed in a period after the completion of the precharge operation of the data line and before release of power-on reset.

2. The semiconductor integrated circuit device (50) as claimed in claim 1, wherein:
   the power-on reset circuit (64; 64A) includes a first CR operation circuit (642) which produces a reset release signal indicative of change of a voltage level at a time point when a first predetermined time period (T1) elapses from the power-on,
   the power-on precharge circuit (66; 66A) including a second CR operation circuit (662) which produces a precharge completion signal indicative of change of a voltage level at a time point when a second predetermined time period (T2) elapses from the power-on,
   the first predetermined time period (T1) being longer than the second predetermined time period (T2).

3. The semiconductor integrated circuit device as claimed in claim 2, wherein the first CR operation circuit (642) has a time constant greater than that of the second CR operation circuit (662).

4. The semiconductor integrated circuit device as claimed in claim 2, wherein the first CR operation circuit (642) and the second CR operation circuit (662) are constructed by the same kinds of circuit elements.

5. The semiconductor integrated circuit device as claimed in claim 2, wherein:
   the power-on reset circuit (64) further includes a first DC operation circuit (644) which produces, in response to the power-on, another reset release signal at a stage when a power supply voltage during transition reaches a first predetermined voltage, and a first logic circuit (646) which performs a logical operation between an output signal of the first CR operation circuit (642) and an output signal of the first DC operation circuit (644) to produce a reset signal;
   the power-on precharge circuit (66) further including a second DC operation circuit (664) which produces, in response to the power-on, another precharge completion signal at a stage when the power supply voltage during transition reaches a second predetermined voltage, and a second logic circuit (666) which performs a logical operation between an output signal of the second CR operation circuit (662) and an output signal of the second DC operation circuit (664) to produce a data line precharge signal;

the first predetermined voltage being higher than the second predetermined voltage.

6. The semiconductor integrated circuit device as claimed in claim 2, wherein:

the nonvolatile memory (76), the power-on reset circuit (64; 64A), and the power-on precharge circuit (66; 66A) are formed on a semiconductor substrate (87);

the power-on reset circuit (64; 64A) and the power-on precharge circuit (66; 66A) having circuit structures substantially identical to each other and formed on the semiconductor substrate (87).

\* \* \* \* \*